(12) United States Patent
Chen et al.

(10) Patent No.: US 12,713,981 B2
(45) Date of Patent: Aug. 18, 2026

(54) STACKED MEMORY POP STRUCTURE AND PACKAGING METHOD THEREOF

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, JiangSu (CN)

( * ) Notice: Subject to any disclaimer, the term of this patent is extended or adjusted under 35 U.S.C. 154(b) by 484 days.

(21) Appl. No.: 18/139,777

(22) Filed: Apr. 26, 2023

(65) Prior Publication Data

US 2023/0352469 A1 Nov. 2, 2023

(30) Foreign Application Priority Data

Apr. 29, 2022 (CN) ........................ 202210474292.7

(51) Int. Cl.

| | |
|---|---|
| ***H10W 90/00*** | (2026.01) |
| ***H10B 80/00*** | (2023.01) |
| ***H10W 74/01*** | (2026.01) |
| *H10W 72/00* | (2026.01) |
| *H10W 72/30* | (2026.01) |
| *H10W 90/24* | (2026.01) |

(52) U.S. Cl.

CPC ............ *H10W 90/00* (2026.01); *H10B 80/00* (2023.02); *H10W 74/01* (2026.01); *H10W 72/073* (2026.01); *H10W 72/07354* (2026.01); *H10W 72/075* (2026.01); *H10W 72/07554* (2026.01); *H10W 72/347* (2026.01); *H10W 72/865* (2026.01); *H10W 72/884* (2026.01); *H10W 90/24* (2026.01); *H10W 90/732* (2026.01); *H10W 90/734* (2026.01); *H10W 90/754* (2026.01)

(58) Field of Classification Search

CPC ......... H01L 25/18; H01L 21/56; H01L 24/32; H10W 90/732; H10W 90/00; H10W 90/24

See application file for complete search history.

(56) References Cited

U.S. PATENT DOCUMENTS

2015/0206866 A1* 7/2015 Yu ........................... H01L 24/81 438/109
2018/0026022 A1* 1/2018 Lee ..................... H01L 23/5386 257/659
2022/0310577 A1* 9/2022 Lee ..................... H01L 23/5389

* cited by examiner

*Primary Examiner* — Errol V Fernandes
(74) *Attorney, Agent, or Firm* — IPRTOP LLC

(57) ABSTRACT

A stacked memory POP structure and method are disclosed. The POP structure includes a first package unit of three-dimensional memory chip package and a system-in-package (SiP) package unit of two-dimensional fan-out peripheral circuit. The first package unit includes: memory chips laminated in a stepped configuration; wire bonding structures; and a first encapsulating layer. The SiP package unit includes: a first rewiring layer; a peripheral circuit chip a second rewiring layer bonded to the peripheral circuit chip; metal connection pillars electrically connected with the first rewiring layer and the second rewiring layer; a second encapsulating layer, which encapsulates the peripheral circuit chip and the metal connection pillars; and metal bumps on the first rewiring layer. The wire bonding structures are wire-bonded to the second rewiring layer to connect the memory chips to the second rewiring layer, thereby achieving attachment between the first package unit and the SiP package unit.

10 Claims, 1 Drawing Sheet

STACKED MEMORY POP STRUCTURE AND PACKAGING METHOD THEREOF

CROSS REFERENCE TO RELATED APPLICATION

The present application claims the benefit of priority to Chinese Patent Application No. CN 202210474292.7, entitled "STACKED MEMORY POP STRUCTURE AND PACKAGING METHOD THEREOF", filed with CNIPA on Apr. 29, 2022, the disclosure of which is incorporated herein by reference in its entirety.

FIELD OF TECHNOLOGY

The present disclosure relates to the technical field of semiconductor packaging, and in particular, to a package-on-package (POP) structure of stacked memory chips and a packaging method thereof.

BACKGROUND

In traditional substrate manufacturing, the printed circuit boards (PCBs) support electronic components, and also serve as carriers for electrical connecting conduits between electronic components. In batch applications, the number of substrate layers is usually not more than 12 layers. The more chip I/O are on the substrates, the more substrate layers will be needed, and the higher the overall cost will be. The production process also has certain limits. Currently, the line width/line spacing has minimum set at 20 μm/20 μm, more frequently 50 μm/50 μm applies. As the front-end chip manufacturing is capable at an increasingly higher integration level in functions, the current substrate technology will no longer be able to support the integrating requirements of the front-end chip manufacturing. Therefore, various advanced packaging techniques have been developed, such as the 2.5D & fan-out wafer level advanced packaging technology. However, these technologies are more expensive and take longer to apply than substrate manufacturing techniques do.

SUMMARY

The present disclosure provides a stacked memory package-on-package (POP) structure, including: a first package unit including a three-dimensional memory chip package; and a system-in-package (SiP) package unit including a two-dimensional fan-out peripheral circuit.

The first package unit of the three-dimensional memory chip package includes: at least two memory chips laminated in a stepped configuration, each of the at least two memory chips being provided with a bonding pad arranged on one of step surfaces of the stepped configuration; wire bonding structures, each of the wire bonding structures having one end electrically connected to the bonding pad of one of the at least two memory chips, and another end electrically connected with the SiP package unit; and a first encapsulating layer, which encapsulates the at least two memory chips and the wire bonding structures.

The SiP package unit of the two-dimensional fan-out peripheral circuit includes: a first rewiring layer having a first surface and a second surface; at least one peripheral circuit chip arranged in two dimensions and electrically connected with the first surface of the first rewiring layer; a second rewiring layer having a first surface and a second surface, the second surface of the second rewiring layer being bonded to the at least one peripheral circuit chip; metal connection pillars, located outside the at least one peripheral circuit chip, each of the metal connection pillars having one end electrically connected with the first surface of the first rewiring layer, and another end electrically connected with the second surface of the second rewiring layer; a second encapsulating layer, which encapsulates the at least one peripheral circuit chip and the metal connection pillars; and metal bumps, formed on the second surface of the first rewiring layer.

The wire bonding structures are wire-bonded to the second rewiring layer, so that the laminated at least two memory chips are connected to the second rewiring layer, achieving attachment between the first package unit of the three-dimensional memory chip package and the SiP package unit of the two-dimensional fan-out peripheral circuit.

The present disclosure further provides a method of packaging a stacked memory package-on-package (POP) structure, including: forming a system-in-package (SiP) package unit including a two-dimensional fan-out peripheral circuit.

The forming of the SiP package unit of the two-dimensional fan-out peripheral circuit including: forming a first rewiring layer having a first surface and a second surface; forming at least one peripheral circuit chip arranged in two dimensions, the at least one peripheral circuit chip being arranged to electrically connect with the first surface of the first rewiring layer; forming a second rewiring layer having a first surface and a second surface, the second surface of the second rewiring layer being bonded to the at least one peripheral circuit chip; forming metal connection pillars, the metal connection pillars being disposed outside the at least one peripheral circuit chip, each of the metal connection pillars having one end electrically connected with the first surface of the first rewiring layer, and another end electrically connected with the second surface of the second rewiring layer; forming a second encapsulating layer, which encapsulates the at least one peripheral circuit chip and the metal connection pillars; and forming metal bumps on the second surface of the first rewiring layer.

The method of packaging the stacked memory POP structure further includes: laminating at least two memory chips in a stepped configuration on the SiP package unit of the two-dimensional fan-out peripheral circuit, each of the at least two memory chips being provided with a bonding pad arranged on one of step surfaces of the stepped configuration; performing wire bonding between the bonding pad and the second rewiring layer to form wire bonding structures, so as to electrically connect the at least two memory chips to the SiP package unit of the two-dimensional fan-out peripheral circuit; and encapsulating the at least two memory chips and the wire bonding structures by a first encapsulating layer.

As mentioned above, the POP structure of stacked memory chips and the packaging method thereof according to the present disclosure adopts a fan-out pattern and realizes a package-on-package (POP) structure by rewiring layers to interconnect a three-dimensional memory chip package unit and a two-dimensional fan-out peripheral circuit chip SiP package unit, thereby obtaining a memory-encapsulated POP structure. In addition, the memory chip can be electrically connected to the rewiring layers by a wire bonding technique, and TSV holes are not required in the entire package structure for any circuit lead-out, which eliminates the circuit substrate required for traditional electronic component packaging, enables for high-density and high-integration device packaging, and achieves the minimum line width/line spacing to be as low as 1.5 μm/1.5 μm. As a result, the process time will be shortened, and the process efficiency will be high. Further, the package thickness dimension can be significantly reduced. Finally, this POP structure makes it possible to realize a one-stop packaging process in which a substrate is used to support the back-end-of-line (BEOL) instead of the middle-end-of-line (MEOL).

DESCRIPTION OF REFERENCE NUMERALS

Figure 1:
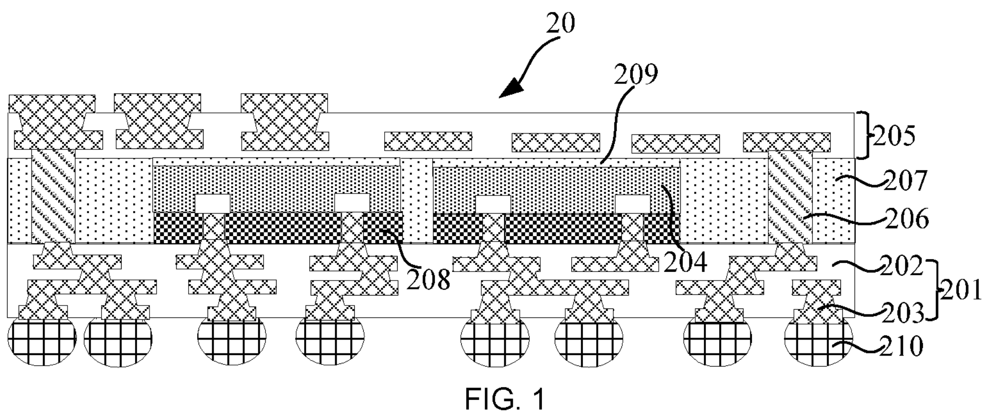
FIG. 1 shows a schematic diagram of a two-dimensional fan-out peripheral circuit chip SiP package unit for a POP structure of stacked memory chips according to the present disclosure.

10 Three-dimensional memory chip package unit
101 Memory chip
102 Bonding pad
103 Wire bonding structure
104 First encapsulating layer
105 First bonding layer
20 Two-dimensional fan-out peripheral circuit chip SiP package unit
201 First rewiring layer
202 Dielectric layer
203 Metal wiring layer
204 Peripheral circuit chip
205 Second rewiring layer
206 Metal connection pillar
207 Second encapsulating layer
208 Bottom filler layer
209 Second bonding layer
210 Metal bumps

DETAILED DESCRIPTION

The embodiments of the present disclosure will be described below. Those skilled in the art can easily understand other advantages and effects of the present disclosure according to contents disclosed by the specification. The present disclosure may also be implemented or applied through other different specific implementation modes. Various modifications or changes may be made to all details in the specification based on different points of view and applications without departing from the spirit of the present disclosure.

Figure 2:
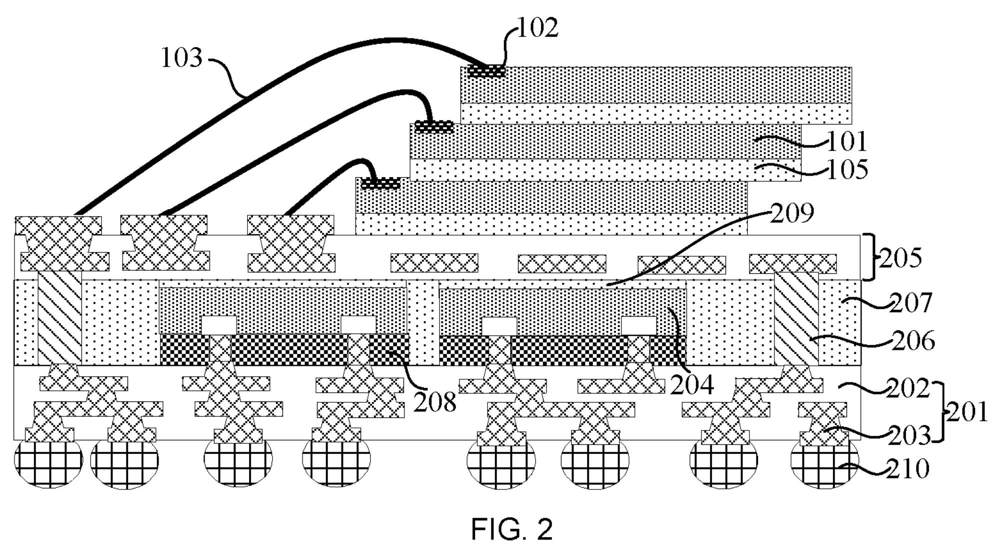
FIG. 2 shows a schematic diagram of the POP structure of stacked memory chips according to the present disclosure, in which the three-dimensional memory chip package unit has not been encapsulated.
Figure 3:
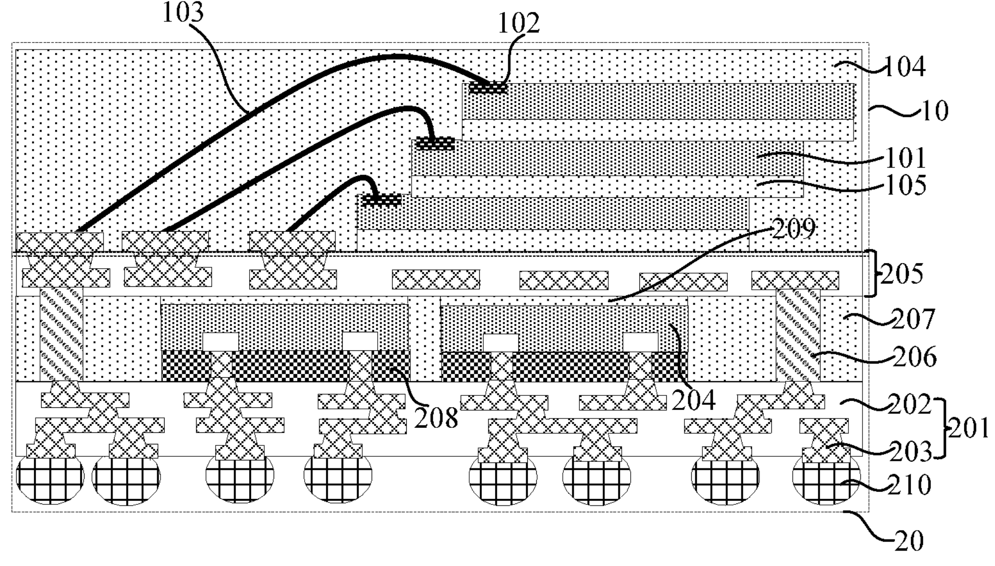
FIG. 3 shows a schematic diagram of a POP structure of stacked memory chips according to the present disclosure, in which the three-dimensional memory chip package unit has been encapsulated.

Please refer to FIGS. 1-3. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be changed according to actual needs, and the component layout configuration thereof may be more complicated.

Embodiment 1

As shown in FIGS. 1-3, a POP structure for a stacked memory device is disclosed. The POP structure includes: a three-dimensional memory chip package unit 10, and a two-dimensional fan-out peripheral circuit chip SiP package unit 20 bonded to the three-dimensional memory chip package unit 10.

As shown in FIG. 3, the three-dimensional memory chip package unit 10 includes: at least two memory chips 101, (as an example there are three memory chips drawn in FIGS. 2-3) laminated in a stepped configuration, each memory chip 101 is provided with a bonding pad 102 arranged on a step surface of the stepped configuration; wire bonding structures 103, each wire bonding structure 103 has one end electrically connected to the bonding pad 102 of a corresponding memory chip 101, and another end electrically connected with the two-dimensional fan-out peripheral circuit chip SiP package unit 20; and a first encapsulating layer 104, which encapsulates the memory chips 101 and the wire bonding structures 103.

As shown in FIG. 1, the two-dimensional fan-out peripheral circuit chip SiP package unit 20 includes: a first rewiring layer 201 having a first surface and a second surface; at least one peripheral circuit chip 204, although two such chips are shown in FIG. 1, arranged in two dimensions and electrically connected with the first surface of the first rewiring layer 201; a second rewiring layer 205 having a first surface and a second surface, the second surface of the second rewiring layer 205 is bonded to the peripheral circuit chip 204; metal connection pillars 206, located away from the outside of the peripheral circuit chip 204, each metal connection pillar 206 has one end electrically connected with the first surface of the first rewiring layer 201, and another end electrically connected with the second surface of the second rewiring layer 205; a second encapsulating layer 207, which encapsulates the peripheral circuit chip 204 and the metal connection pillars 206; and metal bumps 210, formed on the second surface of the first rewiring layer 201.

As shown in FIG. 3, the wire bonding structures 103 are wire-bonded to the second rewiring layer 205, so that the stacked memory chips 101 are bonded to the second rewiring layer 205, to achieve attachment between the three-dimensional memory chip package unit 10 and the two-dimensional fan-out peripheral circuit chip SiP package unit 20.

The POP structure of stacked memory chips provided in this Embodiment 1 adopts a fan-out pattern and realizes a package on package (POP) structure by rewiring layers in which a three-dimensional memory chip package unit 10 and a two-dimensional fan-out peripheral circuit chip SiP package unit 20 are bonded, thereby obtaining a memory-encapsulated POP structure. In addition, the memory chips can be electrically connected to the rewiring layer by a wire bonding method, and the entire package structure does not require TSV holes for circuit lead-out, which eliminates the circuit substrate required for traditional electronic component packaging, allows for high-density and high-integration device packaging, and enables the minimum line width/line spacing to be reduced to 1.5 μm/1.5 μm. The process time can be shortened, and the efficiency is high. Further, the thickness of the package structure can be significantly reduced. Finally, it is possible to realize a one-stop packaging process in which substrate is replaced from the middle-end-of-line (MEOL) to the back-end-of-line (BEOL).

The memory chip 101 can be any memory chip suitable for three-dimensional lamination, such as DRAM, SRAM, flash memory, EEPROM, PRAM, MRAM and RPAM. In addition, the functions of the memory chips 101 in each layer of the laminated memory chips in the stepped configuration may be the same or different, the sizes of the memory chips 101 in each layer may be the same or different, and the sizes of the step surface of the memory chips 101 in each layer can be the same or different. The above parameters may be set according to the specific requirements of the package structure. The peripheral circuit chip 204 is mainly used to drive and control the memory chip 101. The peripheral circuit chip 204 may include peripheral circuit transistors and peripheral logic circuits. The peripheral logic circuits may include, but are not limited to, static random access memory (SRAM), phase locked loop (PLL), central processing unit (CPU), field programmable gate array (FPGA), etc. The design of the peripheral logic circuits depends on the different chips and functions.

As shown in FIG. 1, as an example, a bottom filler layer 208 may be provided between the peripheral circuit chip 204 and the first surface of the first rewiring layer 201, to improve the bond strength between the two and to protect the first rewiring layer 201.

As shown in FIG. 3, as an example, the memory chips 101 are stacked in a stepped configuration by means of a first bonding layer 105. For example, the memory chip 101 at the bottommost layer can be bonded to the second rewiring layer through a first bonding layer 105; the bonding between two separate memory chips 101 at two layers can also be realized by a first bonding layer 105. The second rewiring layer 205 is bonded to the peripheral circuit chip 204 by the second bonding layer 209. The material of the first bonding layer 105 and the second bonding layer 209 may be an insulating material with adhesive properties.

As shown in FIG. 1, the metal connection pillar 206 serves as an electrical connection channel between the first rewiring layer 201 and the second rewiring layer 205, to lead out the signal of the peripheral circuit chip 204. The material of the metal connection pillar 206 may have good conductivity and does not cause outward diffusion, such as gold, silver, aluminum, copper. However, the material of the metal connection pillar 206 is not limited to the above-mentioned, other materials having good conductivity are also applicable.

As shown in FIGS. 1 and 3, the material of the bonding pad 102 on each memory chip 101 includes metallic aluminum, i.e., the bonding pad 102 is an aluminum bonding pad. When preparing the bonding pad 102, an adhesive layer may be formed under the bonding pad 102, and an anti-reflection layer may be formed on the bonding pad 102, in order to improve electrical properties of the bonding pad and enhance the bonding between the bonding pad and the memory chip 101.

As shown in FIG. 3, the wire bonding structures 103 are used to electrically connect the memory chips 10 to the second rewiring layer 205. The material of the wire bonding structures 106 may be selected from metallic materials with good electrical conductivity and are easy to deform, such as one of Cu wire, Au wire, Cu alloy wire, Au alloy wire, and Cu/Au alloy wire.

As shown in FIG. 3, as an example, the material of the first encapsulating layer 104 includes one of polyimide, silicone, and epoxy resin; similarly, the material of the second encapsulating layer 207 includes one of polyimide, silicone, and epoxy resin. Top surfaces of the first encapsulating layer 104 and the second encapsulating layer 207 are both ground or polished flat surfaces, to improve the quality of the subsequently formed rewiring layers and the quality of the package body.

As shown in FIG. 1, as an example, the first rewiring layer 201 and the second rewiring layer 205 each includes a dielectric layer 202 and a metal wiring layer 203. The material of the dielectric layer 202 includes one or a combination of two or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 203 includes one or a combination of two or more of copper, aluminum, nickel, gold, silver, and titanium. It should be noted here that although the first rewiring layer 201 and the second rewiring layer 205 each includes a dielectric layer 202 and a metal wiring layer 203, the material, number of layers and distribution shape of the rewiring layers at different locations will be set according to actual needs and are not limited herein.

As shown in FIG. 1, one of the metal bumps 210 includes a connecting structure, which includes a solder ball, or a metal pillar and a solder ball formed on the metal pillar. Preferably, the solder ball includes one of a gold-tin solder ball, a silver-tin solder ball, and a copper-tin solder ball. Preferably, the metal pillar is a copper pillar or a nickel pillar. In this embodiment 1, the metal bumps 210 are in the form of gold-tin solder balls, the manufacturing steps of which include: first forming a gold-tin layer, then using a high-temperature reflow process to reflow the gold-tin layer into a ball, and then forming a gold-tin solder ball after cooling down; or using a bumping process to form a gold-tin solder ball.

Embodiment 2

As shown in FIGS. 1-3, this embodiment 2 provides a method of packaging a POP structure of stacked memory chips. The POP structure of Embodiment 1 can be prepared using the packaging method of this embodiment 2 as one example. However, the POP structure of Embodiment 1 can also be prepared using other packaging methods.

Specifically, FIGS. 1-3 show schematic diagrams of the structure presented in each step of the packaging method of the POP structure of stacked memory chips according to this embodiment 2.

As shown in FIG. 1, step S1 is first performed to provide a two-dimensional fan-out peripheral circuit chip SiP package unit 20. The two-dimensional fan-out peripheral circuit chip SiP package unit 20 includes: a first rewiring layer 201 having a first surface and a second surface; at least one peripheral circuit chip 204, although two such chips are shown in FIG. 1, arranged in two dimensions and electrically connected with the first surface of the first rewiring layer 201; a second rewiring layer 205 having a first surface and a second surface, the second surface of the second rewiring layer 205 is bonded to the peripheral circuit chip 204; metal connection pillars 206, located away from the outside of the peripheral circuit chip 204, each metal connection pillar 206 has one end electrically connected with the first surface of the first rewiring layer 201, and another end electrically connected with the second surface of the second rewiring layer 205; a second encapsulating layer 207, which encapsulates the peripheral circuit chip 204 and the metal connection pillars 206; and metal bumps 210, formed on the second surface of the first rewiring layer 201.

As an example, the method of forming the two-dimensional fan-out peripheral circuit chip SiP package unit 20 includes: forming the first rewiring layer 201; electrically connecting the at least one peripheral circuit chip 204 arranged in two dimensions to the first rewiring layer 201; electrically connecting the metal connection pillars 206 to the first rewiring layer 201, where the metal connection pillars 206 are formed on an outer side of the peripheral circuit chip 204; encapsulating the peripheral circuit chip 204 and the metal connection pillars 206 using the second encapsulating layer 207; forming the second rewiring layer 205 on the peripheral circuit chip 204 and the metal connection pillars 206, where the second rewiring layer 205 is bonded to the peripheral circuit chip 204, and the metal connection pillars 206 are electrically connected with the second rewiring layer 205; and forming the metal bumps 210 on the first rewiring layer 201. A bottom filler layer 208 may be provided between the peripheral circuit chip 204 and the first surface of the first rewiring layer 201, to improve the bond strength between the two and to protect the first rewiring layer 201. The peripheral circuit chip 204 may be bonded to the second surface of the second rewiring layer 205 by a second bonding layer 209.

As another specific example, the forming of the first rewiring layer 201 may include the following steps: first forming a dielectric layer using a chemical vapor deposition process or a physical vapor deposition process, and etching the dielectric layer to form a patterned dielectric layer 202; then forming a metal wiring layer on a surface of the patterned dielectric layer using a chemical vapor deposition process, a physical vapor deposition process, a sputtering process, an electroplating process, or a chemical plating process, and etching the metal wiring layer to form a patterned metal wiring layer 203. It should be noted here that the material, number of layers and distribution shape of the dielectric layer 202 and the metal wiring layer 203 can be set according to the specific conditions of different memory chips and will not be limited here. The method of forming the second rewiring layer 205 can be referred to the method of forming the first rewiring layer 201 above and will not be repeated herein.

As an example, methods of forming the second encapsulating layer 207 may include molding by compression molding, transfer molding, hydraulic molding, vacuum lamination or spin coating, and then grinding or polishing the encapsulation surface after the molding, to make the surface of the encapsulation layer smooth and improve the quality.

As shown in FIG. 2, step S2 is then performed to laminate two or more memory chips 101 in a stepped configuration on the two-dimensional fan-out peripheral circuit chip SiP package unit 20. Each memory chip 101 is provided with a bonding pad 102 arranged on a step surface of the stepped configuration. Specifically, the two or more memory chips 101 are laminated in a stepped configuration on the first surface of the second rewiring layer 205.

As an example, the bonding of the memory chips 101 may be realized by bonding layers 105 using a surface mount process, for example, the bonding process may include forming a first bonding layer 105 on the first surface of the second rewiring layer 205 and then bonding a memory chip 101 to the first bonding layer 105, and/or forming a first bonding layer 105 on a surface of a memory chip 101 at a lower step of the stepped configuration and then bonding a memory chip 101 at an upper step of the stepped configuration to the first bonding layer 105.

As shown in FIG. 2, step S3 is then performed to form wire bonding structures 103 to realize wire bonding between the bonding pads 102 and the second rewiring layer 205, so as to electrically connect the memory chips 101 to the two-dimensional fan-out peripheral circuit chip SiP package unit 20.

The wire bonding structures 103 may be formed by conventional wire bonding processes, and the length, thickness, bending form and other parameters of a wire bonding structure 103 connecting each layer of memory chip 101 to the second rewiring layer 205 may be set according to the actual needs, as long as the electrical connection effect can be achieved without crosstalk noise.

As shown in FIG. 3, the final step S4 is performed, which includes encapsulating the memory chips 101 and the wire bonding structures 103 by the first encapsulating layer 104. The POP structure of stacked memory chips according to this embodiment 2 is obtained.

As an example, methods of forming the first encapsulating layer 104 may include molding by compression molding, transfer molding, hydraulic molding, vacuum lamination or spin coating, and then grinding or polishing the encapsulation surface after the molding, to make the surface of the encapsulation layer smooth and improve the quality.

As mentioned above, the POP structure of stacked memory chips and the packaging method thereof according to the present disclosure adopts a fan-out pattern and realizes a package-on-package (POP) structure by rewiring layers to interconnect a three-dimensional memory chip package unit and a two-dimensional fan-out peripheral circuit chip SiP package unit, thereby obtaining a memory-encapsulated POP structure. In addition, the memory chip can be electrically connected to the rewiring layers by a wire bonding technique, and TSV holes are not required in the entire package structure for any circuit lead-out, which eliminates the circuit substrate required for traditional electronic component packaging, enables for high-density and high-integration device packaging, and achieves the minimum line width/line spacing to be as narrow as 1.5 μm/1.5 μm. As a result, the process time will be shortened, and the process efficiency will be high. Further, the package thickness dimension can be significantly reduced. Finally, this POP structure makes it possible to realize a one-stop packaging process in which a substrate is used to support the back-end-of-line (BEOL) instead of the middle-end-of-line (MEOL). Therefore, the present disclosure effectively overcomes various shortcomings in the existing technology and has high industrial utilization value.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

What is claimed is:

1. A stacked memory package-on-package (POP) structure, comprising:

a first package unit comprising a three-dimensional memory chip package; and a system-in-package (SiP) package unit comprising a two-dimensional fan-out peripheral circuit, wherein the SiP package unit of the two-dimensional fan-out peripheral circuit comprises:

a first rewiring layer having a first surface and a second surface;

at least one peripheral circuit chip arranged in two dimensions and electrically connected with the first surface of the first rewiring layer;

a second rewiring layer having a first surface and a second surface, wherein the second surface of the second rewiring layer is bonded to the at least one peripheral circuit chip;

metal connection pillars, located outside the at least one peripheral circuit chip, wherein each of the metal connection pillars has one end electrically connected with the first surface of the first rewiring layer, and another end electrically connected with the second surface of the second rewiring layer;

a second encapsulating layer, wherein the second encapsulating layer encapsulates the at least one peripheral circuit chip and the metal connection pillars; and metal bumps, wherein the metal bumps are formed on the second surface of the first rewiring layer; and wherein the first package unit of the three-dimensional memory chip package comprises:

a stepped configuration having a first step surface and a second step surface on the first step surface;

a first memory chip laminated on the first step surface, a second memory chip laminated on the second step surface, wherein the first memory chip is provided with a first bonding pad arranged on the first step surface, and the second memory chips is provided with a second bonding pad arranged on the second step surface;

a first wire bonding structure and a second wire bonding structure, wherein the first wire bonding structure has one end electrically connected to the first memory chip via the first bonding pad on the first step surface and another end connected to the first surface of the second rewiring layer in the SiP package unit, and wherein the second wire bonding structure has one end electrically connected to the second memory chip via the second bonding pad on the second step surface and another end connected to the first surface of the second rewiring layer in the SiP package unit; and a first encapsulating layer, wherein the first encapsulating layer encapsulates the first and the second memory chips, and the first and second wire bonding structures;

and wherein the first package unit of the three-dimensional memory chip package and the SiP package unit of the two-dimensional fan-out peripheral circuit are attached.

2. The stacked memory POP structure according to claim 1, wherein a bottom filler layer is provided between the at least one peripheral circuit chip and the first surface of the first rewiring layer; wherein the first and second memory chips are stacked in the stepped configuration by means of first bonding layers; and wherein the second surface of the second rewiring layer is bonded to the at least one peripheral circuit chip by a second bonding layer.

3. The stacked memory POP structure according to claim 1, wherein a material of the metal connection pillars comprises at least one of gold, silver, aluminum, copper; and wherein a material of the bonding pad comprises metallic aluminum.

4. The stacked memory POP structure according to claim 1, wherein a material of the first and second wire bonding structures comprises gold or copper; wherein a material of the first encapsulating layer comprises one of polyimide, silicone, and epoxy resin; and a material of the second encapsulating layer comprises one of polyimide, silicone, and epoxy resin.

5. The stacked memory POP structure according to claim 1, wherein each of the first rewiring layer and the second rewiring layer comprises a dielectric layer and a metal wiring layer; wherein a material of the dielectric layer comprises one or a combination of two or more of epoxy resin, silicone, polyimide (PI), polybenzoxazole (PBO), benzocyclobutene (BCB), silicon oxide, phosphorosilicate glass, and fluorine-containing glass, and wherein a material of the metal wiring layer comprises one or a combination of two or more of copper, aluminum, nickel, gold, silver, and titanium.

6. The stacked memory POP structure according to claim 1, wherein one of the metal bumps comprises a connecting structure, which includes a solder ball, or a metal pillar, or a solder ball formed on the metal pillar, wherein the solder ball comprises one of a gold-tin solder ball, a silver-tin solder ball, and a copper-tin solder ball.

7. A method of packaging a stacked memory package-on-package (POP) structure, comprising:

forming a system-in-package (SiP) package unit, comprising forming a two-dimensional fan-out peripheral circuit, wherein forming the two-dimensional fan-out peripheral circuit comprises:

forming a first rewiring layer having a first surface and a second surface;

forming at least one peripheral circuit chip arranged in two dimensions, wherein the at least one peripheral circuit chip is arranged to electrically connect with the first surface of the first rewiring layer;

forming a second rewiring layer having a first surface and a second surface, wherein the second surface of the second rewiring layer is bonded to the at least one peripheral circuit chip;

forming metal connection pillars, wherein the metal connection pillars are disposed outside the at least one peripheral circuit chip, wherein each of the metal connection pillars has one end electrically connected with the first surface of the first rewiring layer, and another end electrically connected with the second surface of the second rewiring layer;

forming a second encapsulating layer, wherein the second encapsulating layer encapsulates the at least one peripheral circuit chip and the metal connection pillars; and forming metal bumps on the second surface of the first rewiring layer;

forming a first package unit, comprising forming a three-dimensional memory chip package, wherein forming thea three-dimensional memory chip package comprises;

forming a stepped configuration on the first surface of the second rewiring layer in the SiP package unit, wherein the stepped configuration comprises a first step surface and a second step surface on the first step surface;

forming a first memory chip on the first step surface and forming a second memory chip on the second step surface;

forming a first wire bonding structure having one end electrically bonded to the first memory chip via a first bonding pad on the first step surface and another end bonded to the first surface of the second rewiring layer in the SiP package unit;

forming a second wire bonding structure having one end electrically bonded to the second memory chip via a second bonding pad on the second step surface and another end bonded to the first surface of the second rewiring layer in the SiP package unit; and encapsulating the first and the second memory chips and the first and the second wire bonding structures by a first encapsulating layer, so as to bond the first package unit of the three-dimensional memory chip package and the SiP package unit of the two-dimensional fan-out peripheral circuit together.

8. The method of packaging the stacked memory POP structure according to claim 7, wherein forming the SiP package unit of the two-dimensional fan-out peripheral circuit comprises:

forming the first rewiring layer having the first surface and the second surface;

electrically connecting the at least one peripheral circuit chip to the first surface of the first rewiring layer;

electrically connecting the metal connection pillars to the first surface of the first rewiring layer, wherein the metal connection pillars are formed outside of the at least one peripheral circuit chip;

encapsulating the at least one peripheral circuit chip and the metal connection pillars with the second encapsulating layer;

forming the second rewiring layer on the at least one peripheral circuit chip and the metal connection pillars, wherein the second rewiring layer is bonded to the at least one peripheral circuit chip, and the metal connection pillars are electrically connected with the second rewiring layer; and forming the metal bumps on the second surface of the first rewiring layer.

9. The method of packaging the stacked memory POP structure according to claim 7, wherein the first and the second memory chips are laminated on the first surface of the second rewiring layer by a surface mount process.

10. The method of packaging the stacked memory POP structure according to claim 7, further comprising grinding or polishing a top surface of the first encapsulating layer and a top surface of the second encapsulating layer after forming the first encapsulating layer and the second encapsulating layer.

* * * * *